US012082442B2

(12) United States Patent
Jang et al.

(10) Patent No.: US 12,082,442 B2
(45) Date of Patent: Sep. 3, 2024

(54) DISPLAY DEVICE AND MANUFACTURING METHOD THEREOF

(71) Applicant: Samsung Display Co., LTD., Yongin-si (KR)

(72) Inventors: Daehwan Jang, Seoul (KR); Sunghoon Kim, Asan-si (KR); Hyuk-Hwan Kim, Suwon-si (KR); Seokhyun Nam, Seoul (KR); Haengwon Park, Seongnam-si (KR); Jin Ho Cho, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/526,676

(22) Filed: Dec. 1, 2023

(65) Prior Publication Data

US 2024/0114719 A1 Apr. 4, 2024

Related U.S. Application Data

(62) Division of application No. 17/172,762, filed on Feb. 10, 2021, now Pat. No. 11,871,614.

(30) Foreign Application Priority Data

Jun. 5, 2020 (KR) .................. 10-2020-0068133

(51) Int. Cl.
  *H10K 50/87* (2023.01)
  *H10K 50/115* (2023.01)
  *H10K 59/38* (2023.01)
  *H10K 71/00* (2023.01)

(52) U.S. Cl.
  CPC .......... *H10K 50/87* (2023.02); *H10K 50/115* (2023.02); *H10K 59/38* (2023.02); *H10K 71/00* (2023.02)

(58) Field of Classification Search
  CPC ...... H10K 50/87; H10K 50/115; H10K 59/38; H10K 71/00; H10K 50/8423; H10K 50/80; H10K 77/10; H10K 59/12; H10K 2102/331; Y02E 10/549; G02B 5/201; G02B 5/206; H01L 27/1218; H01L 27/1262
  See application file for complete search history.

(56) References Cited

U.S. PATENT DOCUMENTS

| 9,265,182 | B2 | 2/2016 | Seo |
| 9,356,259 | B2 | 5/2016 | Mun et al. |
| 9,470,895 | B2 | 10/2016 | Sakaue et al. |
| 9,757,923 | B2 | 9/2017 | Shin et al. |
| 2012/0206031 | A1 | 8/2012 | Hiroki et al. |
| 2016/0027718 | A1 | 1/2016 | Park et al. |
| 2016/0161770 | A1 | 6/2016 | Joo et al. |

(Continued)

FOREIGN PATENT DOCUMENTS

| KR | 10-1996653 | 7/2019 |
| KR | 10-2111022 | 5/2020 |

*Primary Examiner* — Caleb E Henry
(74) *Attorney, Agent, or Firm* — KILE PARK REED & HOUTTEMAN PLLC

(57) ABSTRACT

A display device includes a first substrate including at least one first opening part defined, a pixel disposed on the first substrate, at least one first heat dissipation layer disposed in the at least one first opening part, an insulation layer disposed under the first substrate and including at least one second opening part overlapping the at least one first opening part, and a second heat dissipation layer disposed in the at least one second opening part.

9 Claims, 17 Drawing Sheets

(56) References Cited

U.S. PATENT DOCUMENTS

| | | |
|---|---|---|
| 2019/0196641 A1 | 6/2019 | Ryu et al. |
| 2020/0075882 A1 | 3/2020 | Wang et al. |
| 2020/0209674 A1* | 7/2020 | Won .................. H04R 3/12 |
| 2020/0371570 A1* | 11/2020 | Wang .............. H10K 59/8794 |
| 2020/0400874 A1 | 12/2020 | Oh et al. |

* cited by examiner

DISPLAY DEVICE AND MANUFACTURING METHOD THEREOF

CROSS-REFERENCE TO RELATED APPLICATION(S)

This is a divisional application of U.S. patent application Ser. No. 17/172,762 filed Feb. 10, 2021 (now pending), the disclosure of which is incorporated herein by reference in its entirety. U.S. patent application Ser. No. 17/172,762 claims priority to and benefits of Korean Patent Application No. 10-2020-0068133 under 35 U.S.C. § 119, filed Jun. 5, 2020, in the Korean Intellectual Property Office, the entire contents of which are incorporated herein by reference.

BACKGROUND

The disclosure relates to a display device and a manufacturing method thereof.

An electronic device such as a smartphone, a digital camera, a notebook computer, a navigation device, a smart TV, or the like, which provides an image to a user, includes a display device for displaying the image. The display device generates an image and provides the generated image to the user through a display screen.

The display device includes a display panel including pixels, and a driving unit electrically connected to the display panel to drive the pixels. Each of the pixels includes an image display element and a driving element electrically connected to the image display element. The driving element drives the image display element, and the image display element generates predetermined light to display an image to a user.

In case that the pixels are driven, heat may be generated in the display panel, which may reduce the efficiency and lifetime of the pixels. Accordingly, it is required to develop a technology for dissipating the heat generated in the display panel to the outside.

SUMMARY

The disclosure provides a display device capable of enhancing a heat dissipation function, and a manufacturing method thereof.

In an embodiment, a display device may include a first substrate including at least one first opening part; a pixel disposed on the first substrate; at least one first heat dissipation layer disposed in the at least one first opening part; an insulation layer disposed under the first substrate and including at least one second opening part overlapping the at least one first opening part; and a second heat dissipation layer disposed in the at least one second opening part.

The second heat dissipation layer may be disposed under the first substrate and overlap the insulation layer.

The second heat dissipation layer may contact the at least one first heat dissipation layer in the at least one second opening part.

The second heat dissipation layer may be disposed to have a step structure on a bottom surface of the insulation layer under the at least one first heat dissipation layer.

The at least one first heat dissipation layer may have a greater thickness than a thickness of the second heat dissipation layer.

The display device may further comprise an etching stop layer disposed between the first substrate and the pixel.

The at least one first heat dissipation layer, the second heat dissipation layer, and the etching stop layer may comprise a metal material.

In a plan view, the at least one first opening part, the at least one second opening part, the at least one first heat dissipation layer may have a circular shape, a polygonal shape, or an elliptical shape.

The pixel may comprise a light emitting area; and a non-light emitting area adjacent to the display area. In a plan view, the at least one first heat dissipation layer may overlap the light emitting area.

The display device may further comprise a second substrate disposed on the first substrate; a color filter disposed under the second substrate and overlapping the light emitting area in the plan view; and a quantum dot layer disposed under a color filter and overlapping the light emitting area in the plan view. The quantum dot layer may be disposed on the pixel.

The at least one first opening part may comprise a plurality of first opening parts, the at least one second opening part may comprise a plurality of second opening parts, and the at least one first heat dissipation layer may comprise a plurality of first heat dissipation layers.

In an embodiment, a manufacturing method of a display device may include forming an insulation layer under a first substrate including a first removal part and a first peripheral part adjacent to the first removal part; forming a pixel on the first substrate; removing a second removal part of the insulation layer which overlaps the first removal part in a plan view; removing the first removal part; forming a first heat dissipation layer in the first opening part of the first substrate the first opening part being formed by the removing of the first removal part; and forming a second heat dissipation layer in a second opening part of the insulation layer, the second opening part being formed by the removing of the second removal part.

The forming of the first heat dissipation layer in the first opening part may include an inkjet printing process or a dispensing process.

The forming of the second heat dissipation layer in the second opening part may include a sputtering process.

The forming of the second heat dissipation layer may comprise forming the second heat dissipation layer under the first substrate to overlap the insulation layer.

The forming of the second heat dissipation layer may comprise forming the second heat dissipation layer to contact the first heat dissipation layer in the second opening part and to have a step structure on a bottom surface of the insulation layer under the first heat dissipation layer.

The first heat dissipation layer may have a greater thickness than a thickness of the second heat dissipation layer.

The manufacturing method may further comprise forming an etching stop layer on the first substrate. The forming of the pixel may comprise disposing the pixel on the etching stop layer on the first substrate.

The pixel may comprise a light emitting area; and a non-light emitting area adjacent to the light emitting area. The first heat dissipation layer may overlap the light emitting area in the plan view.

The manufacturing method may further comprise irradiating the first removal part with a laser beam.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
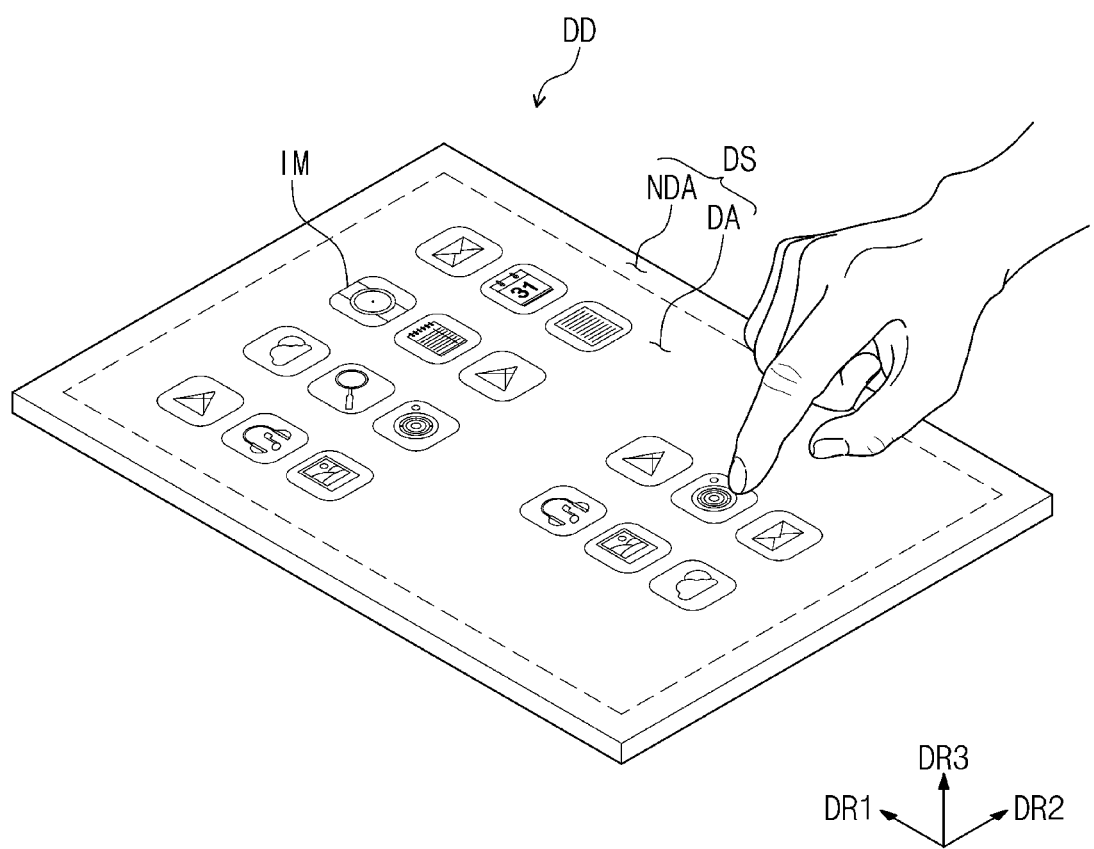
FIG. 1 is a schematic perspective view of a display device according to an embodiment.

It will be understood that when an element or layer is referred to as being "on", "connected to" or "coupled to" another element or layer, it can be directly on, connected or coupled to the other element or intervening third elements may be present.

Like reference numerals in the drawings refer to like elements. In addition, in the drawings, the thickness and the ratio and the dimension of the element may be exaggerated for effective description of the technical contents.

The term "and/or" includes any and all combinations of one or more of the associated items. In the specification and the claims, the phrase "at least one of" is intended to include the meaning of "at least one selected from the group of" for the purpose of its meaning and interpretation. For example, "at least one of A and B" may be understood to mean "A, B, or A and B."

Terms such as first, second, and the like may be used to describe various components, but these components should not be limited by the terms. These terms are only used to distinguish one element from another. For instance, a first component may be referred to as a second component, or similarly, a second component may be referred to as a first component, without departing from the scope of the disclosure. As used herein, the singular forms "a," "an," and "the" may be intended to include the plural forms as well, unless the context clearly indicates otherwise.

In addition, the terms such as "under," "lower," "on," and "upper" are used for explaining associations of items illustrated in the drawings. It will be understood that the spatially relative terms are intended to encompass different orientations of the device in use or operation in addition to the orientation depicted in the figures.

Unless otherwise defined or implied herein, all terms (including technical and scientific terms) used herein have the same meaning as commonly understood by one of ordinary skill in the art to which this disclosure pertains. It will be further understood that terms, such as those defined in commonly-used dictionaries, should be interpreted as having a meaning that is consistent with their meaning in the context of the relevant art and should not be interpreted in an ideal or excessively formal sense unless clearly defined herein.

It will be further understood that the terms "include" and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, embodiments of the invention will be described in detail with reference to the accompanying drawings.

FIG. 1 is a schematic perspective view of a display device according to an embodiment.

Referring to FIG. 1, the display device DD may have a rectangular shape including long sides extending in a first direction DR1 and short sides extending in a second direction DR2 intersecting the first direction DR1. However, the display device DD is not limited thereto and may have various shapes such as a circular shape and a polygonal shape.

Hereinafter, a direction, which substantially vertically intersects a plane defined by the first and second directions DR1 and DR2, is defined as a third direction DR3. The meaning of the phrase "when viewed on a plane" or "in a plan view" is defined as viewing the object in the third direction DR3.

The top surface of the display device DD may be defined as a display surface DS and may include a surface defined by the first direction DR1 and the second direction DR2. Images IM generated in the display device DD may be provided to the user through the display surface DS.

The display surface DS may include a display part DA and a non-display part NDA around the display part DA. The display part DA displays an image, and the non-display part NDA may not display an image. The non-display part NDA may surround or be adjacent to the display part DA, and define the boundary of the display device DD, which is printed in predetermined color.

The display device DD may be used in a large electronic device such as a television, a monitor, and an outdoor billboard. The display device ED may be a small or medium-sized electronic device such as a personal computer, a laptop computer, a personal digital assistant, a vehicle navigator, a game console, a smartphone, a tablet, or a camera, etc. However, these are only presented as examples, and the display device DD may be adopted in other electronic devices without being deviated from the inventive concept.

Figure 2:
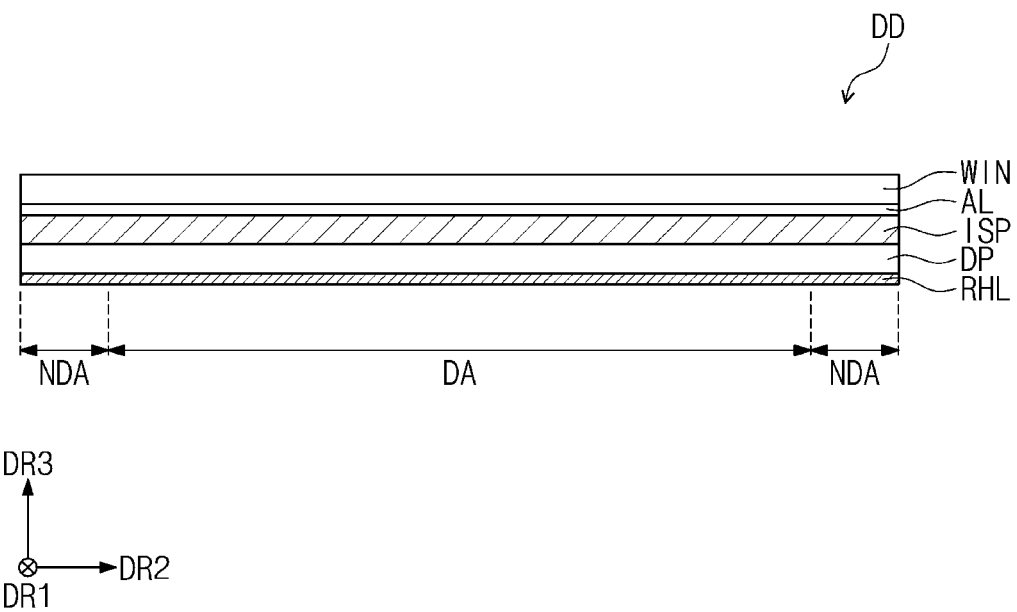
FIG. 2 is a schematic cross-sectional view illustrating a cross-section of the display device shown in FIG. 1.

FIG. 2 is a schematic cross-sectional view illustrating a cross-section of the display device shown in FIG. 1.

For example, FIG. 2 shows the cross-section of the display device DD viewed in the first direction DR1.

With reference to FIG. 2, the display device DD may include a display panel DP, an input sensing part ISP, a window WIN, an adhesive layer AL, and a heat dissipation layer RHL. The display panel DP may be a rigid type, but is not limited thereto, and may be a flexible type.

The display panel DP according to an embodiment may be an emissive display panel. For example, the display panel DP may be an organic light emitting display panel or a quantum dot light emitting display panel. A light emitting layer of the organic light emitting display panel includes an organic light emitting material. A light emitting layer of the quantum dot light emitting display panel may include a quantum dot, a quantum rod, or the like. Hereinafter, the display panel DP will be described as an organic light emitting display panel.

The input sensing part ISP may be disposed on the display panel DP. The input sensing part ISP may include sensors (not shown) for sensing an external input in an electrostatic capacitive manner. When manufacturing the display device DD, the input sensing part ISP may be manufactured directly on the display panel DP. However, the embodiments are not limited thereto, and the input sensing part ISP may be manufactured as a separate panel from the display panel DP and may be attached to the display panel DP by means of the adhesive. The input sensing part ISP may be omitted.

The window WIN may be disposed on the input sensing part ISP. The window WIN may protect the display panel DP and the input sensing part ISP from an external scratch or impact. The adhesive layer AL may be disposed between the input sensing part ISP and the window WIN to laminate them with each other.

The heat dissipation layer RHL may be disposed under the display panel DP. The heat dissipation layer RHL may dissipate heat generated in the display panel DP. The specific configuration of the heat dissipation layer RHL will be described in detail.

Figure 3:
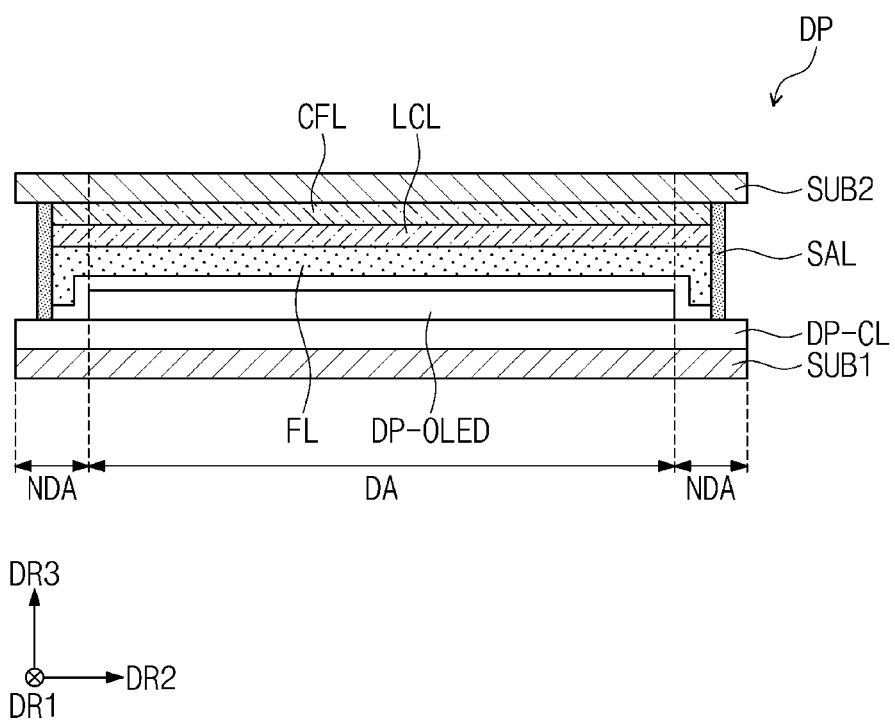
FIG. 3 is a schematic cross-sectional view illustrating a cross-section of a display panel shown in FIG. 2.

FIG. 3 is a schematic cross-sectional view illustrating a cross-section of the display panel shown in FIG. 2.

For example, FIG. 3 shows the cross-section of the display panel DP viewed in the first direction DR1.

Referring to FIG. 3, the display panel DP may include a first substrate SUB1, a second substrate SUB2, a circuit element layer DP-CL, a display element layer DP-OLED, a thin film encapsulation layer TFE (see, e.g., FIG. 4), a color filter layer CFL, a light conversion layer LCL, a filling material FL, and a sealant SAL.

The second substrate SUB2 may be disposed on the first substrate SUB1 to face or overlap the first substrate SUB1. The circuit element layer DP-CL, the display element layer DP-OLED, the thin film encapsulation layer TFE, the color filter layer CFL, the light conversion layer LCL, the filling material FL, and the sealant SAL may be disposed between the first substrate SUB1 and the second substrate SUB2.

Each of the first substrate SUB1 and the second substrate SUB2 may include glass, but is not limited thereto, and may include a flexible plastic material such as polyimide (PI). In a plan view, the first substrate SUB1 may include a display part DA and a non-display area NDA around or adjacent to the display part DA.

The circuit element layer DP-CL may be disposed on the first substrate SUB1. The display element layer DP-OLED may be disposed on the circuit element layer DP-CL. The display element layer DP-OLED may be disposed on the display part DA.

Pixels may be disposed in the circuit element layer DP-CL and the display element layer DP-OLED. Each of the pixels may include a transistor disposed in the circuit element layer DP-CL and a light emitting element disposed in the display element layer DP-OLED and electrically connected to the transistor. Hereinafter, the configuration of a pixel will be described in detail.

The thin film encapsulation layer TFE may be disposed on the circuit element layer DP-CL so as to cover or overlap the display element layer DP-OLED. The thin film encapsulation layer TFE may protect the pixels from moisture, oxygen, and an external foreign matter.

The color filter layer CFL may be disposed under the second substrate SUB2. In a plan view, the color filter layer CFL may overlap the display part DA. The light conversion layer LCL may be disposed under the color filter layer CFL. In a plan view, the light conversion layer LCL may overlap the display part DA.

In a plan view, the sealant SAL may overlap the non-display part NDA. The sealant SAL may be disposed between the first substrate SUB1 and the second substrate SUB2. The first substrate SUB1 and the second substrate SUB2 may be laminated with each other by means of the sealant SAL. The sealant SAL may include a UV curable material.

The filling material FL may be disposed between the light conversion layer LCL and the thin film encapsulation layer TFE. The filling material FL may extend towards the non-display part to contact the sealant SAL. The filling material FL may include silicon, epoxy, and an acrylic heat curable material.

The light generated in the display element layer DP-OLED may be provided to the light conversion layer LCL. The light conversion layer LCL may convert the color of the light provided from the display element layer DP-OLED. The light, the color of which is changed, may be output to the outside through the color filter layer CFL and the second substrate SUB2.

The color filter layer CFL may prevent reflection of the external light provided to the display panel DP from the outside. Such a function of the color filter layer CFL will be described in detail below.

Figure 4:
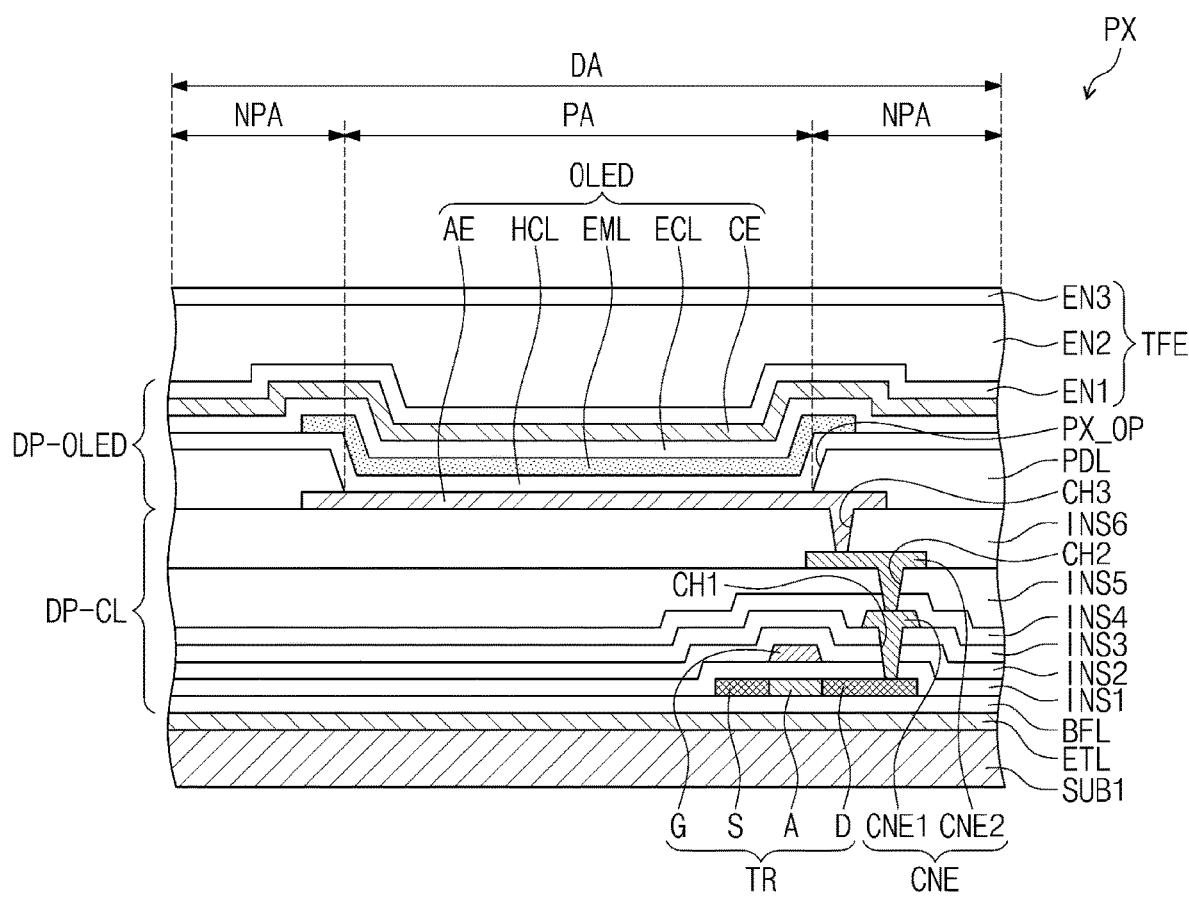
FIG. 4 is a schematic cross-sectional view illustrating a cross-section of a pixel disposed in a circuit element layer and a display element layer illustrated in FIG. 3.

FIG. 4 is a schematic cross-sectional view illustrating a cross-section of a pixel disposed in the circuit element layer and the display element layer illustrated in FIG. 3.

Referring to FIG. 4, the pixel PX may be disposed on the first substrate SUB1 and include a transistor TR and a light emitting element OLED. The light emitting element OLED may include a first electrode AE, a second electrode CE, a hole control layer HCL, an electron control layer ECL, and a light emitting layer EML. The first electrode AE may be an anode, and the second electrode CE may be a cathode.

The transistor TR and the light emitting element OLED may be disposed on the first substrate SUB1. A transistor TR is illustrated, but the pixel PX may include multiple transistors for driving the light emitting element OLED and at least one capacitor.

The display part DA may include light emitting areas PA respectively corresponding to the pixels PX and non-light emitting areas NPA adjacent to the light emitting areas PA. The light emitting element OLED may be disposed in the light emitting area PA.

An etching stop layer ETL may be disposed on the first substrate SUB1. The etching stop layer ETL may include a metal material such as molybdenum. The function of the etching stop layer ETL will be described in detail below.

A buffer layer BFL may be disposed on the etching stop layer ETL, and the buffer layer BFL may be an inorganic layer. A semiconductor pattern may be disposed on the buffer layer BFL. The semiconductor pattern may include polysilicon. However, the embodiments are not limited thereto. For example, the semiconductor pattern may include amorphous silicon or metal oxides.

The semiconductor pattern may have different properties depending on whether it is doped. The semiconductor pattern may include a doped area and a non-doped area. The doped area may be doped with an N-type dopant or a P-type dopant. The conductivity of the doped area is greater than that of the non-doped area and may substantially play roles of the source electrode and drain electrode. The non-doped area substantially corresponds to an active layer (or a channel) of the transistor.

The source S, the active layer A, and the drain D of the transistor TR may be formed from the semiconductor pattern. A first insulation layer INS1 may be disposed on the semiconductor pattern. The gate G of the transistor TR may be disposed on the first insulation layer INS1. A second insulation layer INS2 may be disposed on the gate G. A third insulation layer INS3 may be disposed on the second insulation layer INS2.

A connection electrode CNE may be disposed between the transistor TR and the light emitting element OLED to electrically connect them with each other. The connection electrode CNE may include a first connection electrode CNE1 and a second connection electrode CNE2.

The first connection electrode CNE1 may be disposed on the third insulation layer INS3 and may be electrically connected to the drain D through a first contact hole CH1 defined in the first to third insulation layers INS1 to INS3. A fourth insulation layer INS4 may be disposed on the first connection electrode CNE1. A fifth insulation layer INS5 may be disposed on the fourth insulation layer INS4. The second connection electrode CNE2 may be disposed on the fifth insulation layer INS5 and may be electrically connected to the first connection electrode CNE1 through a second contact hole CH2 defined in the fifth insulation layers INS5.

A sixth insulation layer INS6 may be disposed on the second connection electrode CNE2. The layers from the buffer layer BFL to the sixth insulation layers INS6 may be defined as the circuit element layer DP-CL. The first insulation layer INS1 to the sixth insulation layer INS6 may be inorganic layers or organic layers.

The first electrode AE may be disposed on the sixth insulation layer INS6. The first electrode AE may be electrically connected to the second connection electrode CNE2 through a third contact hole CH3 defined in the sixth insulation layer INS6. A pixel definition layer PDL for exposing a predetermined part of the first electrode AE may be disposed on the first electrode AE and the sixth insulation layer INS6. In the pixel definition layer PDL, an opening part PX_OP may be defined to expose the predetermined part of the first electrode AE.

The hole control layer HCL may be disposed on the first electrode AE and the pixel definition layer PDL. The hole control layer HCL may be commonly disposed in the light emitting area PA and the non-light emitting area NPA. The hole control layer HCL may include a hole transport layer and a hole injection layer.

The light emitting layer EML may be disposed on the hole control layer HCL. The light emitting layer EML may be disposed in an area corresponding to the opening part PX_OP. The light emitting layer EML may include an organic material and/or inorganic material. The light emitting layer EML may generate first light. The first light may be blue light.

The electron control layer ECL may be disposed on the light emitting layer EML and the hole control layer HCL. The electron control layer ECL may be commonly disposed in the light emitting area PA and the non-light emitting area NPA. The electron control layer ECL may include an electron transport layer and an electron injection layer.

The second electrode CE may be disposed on the electron control layer ECL. The second electrode CE may be commonly disposed in the pixels PX. The layer on which the light emitting element OLED is disposed may be defined as the display element layer DP-OLED.

The thin film encapsulation layer TFE may be disposed on the second electrode CE to cover or overlap the pixels PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may be inorganic layers, and the second encapsulation layer EN2 may be an organic layer. The first and third encapsulation layers EN1 and EN3 may protect the pixels PX from moisture/oxygen. The second encapsulation layer EN2 may protect the pixels PX from a foreign matter such as a dust particle.

A first voltage may be applied to the first electrode AE, and a second voltage, which has a lower level than the first voltage, may be applied to the second electrode CE through the transistor TR. A hole and an electron injected to the light emitting layer EML may be combined to form an exciton, and the light emitting element OLED may emit light while the exciton is transitioned to the ground state.

Figure 5:
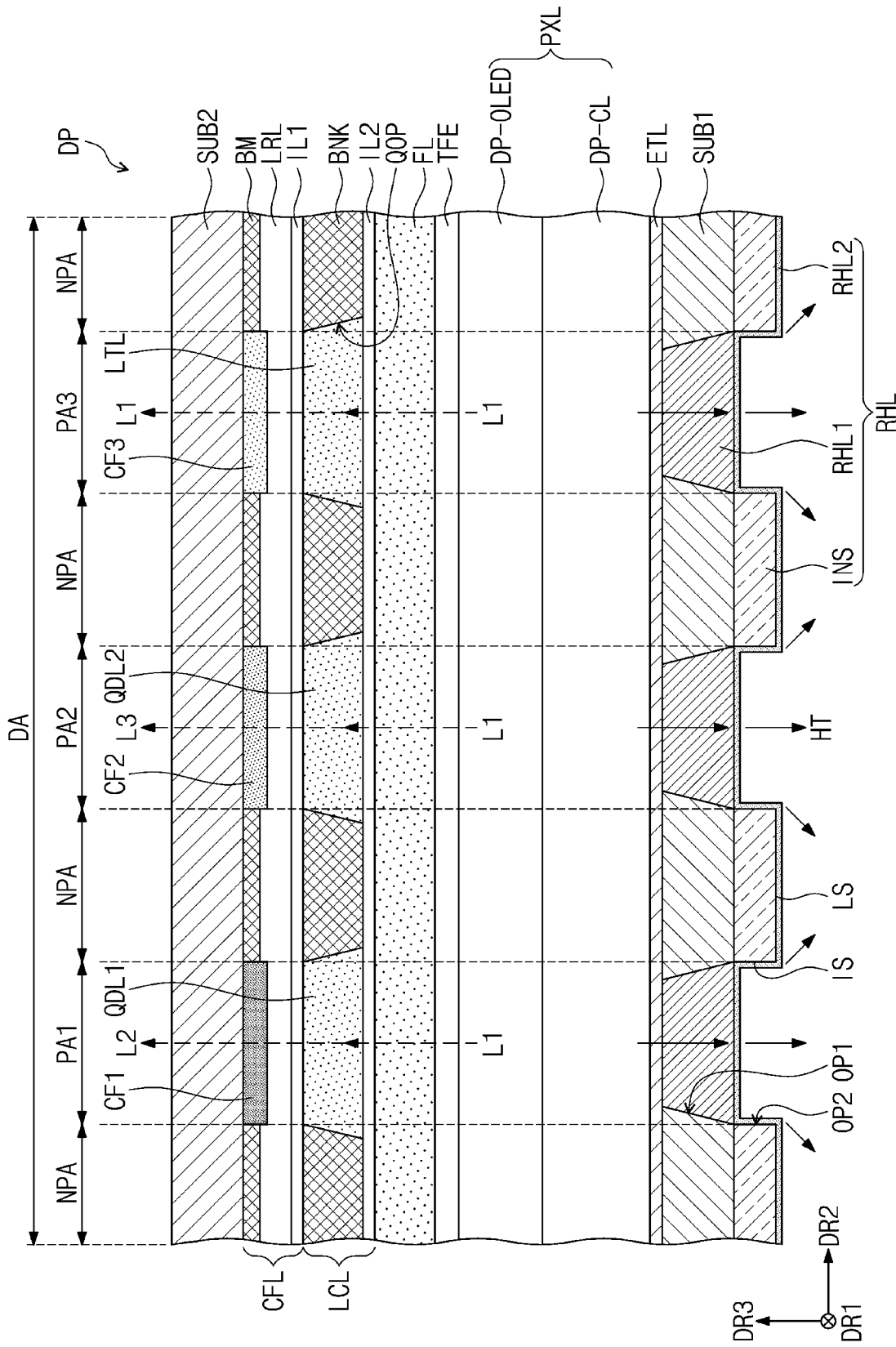
FIG. 5 is a schematic cross-sectional view illustrating a cross-section of a part of the display panel shown in FIG. 3.

FIG. 5 is a schematic cross-sectional view illustrating a cross-section of a part of the display panel shown in FIG. 3.

FIG. 5 illustrates a cross-section of the display panel DP corresponding to three light emitting areas PA1, PA2, and PA3, and the transistors TR disposed in the circuit element layer DP-CL and the light emitting elements OLED disposed in the display element layer DP-OLED are omitted.

Referring to FIG. 5, a pixel layer PXL may be disposed on the first substrate SUB1. The pixel layer PXL may include the foregoing circuit element layer DP-CL and display element layer DP-OLED. The etching stop layer ETL may be disposed between the first substrate SUB1 and the pixel layer PXL.

The display part DA may include the first light emitting area PA1, the second light emitting area PA2, the third light emitting area PA3, and the respective non-light emitting areas NPA around or adjacent to the first, second, and third light emitting area PA1, PA2, and PA3.

The light emitting area PA illustrated in FIG. 4 may be any one among the first, second, and third light emitting areas PA1, PA2, and PA3 illustrated in FIG. 5. The foregoing light emitting elements OLED may be disposed in the first, second, and third light emitting areas PA1, PA2, and PA3. The first, second, and third pixel areas PA1, PA2 and PA3 may generate first beams of light L1. For example, the first light L1 may be blue light.

The color filter layer CFL may include a first color filter CF1, a second color filter CF2, a third color filter CF3, a black matrix BM, a low refraction layer LRL, and a first insulation layer ILL A first color filter CF1, a second color filter CF2, and a third color filter CF3 are illustrated, but multiple first color filters CF1, multiple second color filters CF2, and multiple third color filters CF3 may be provided.

The light conversion layer LCL may include a first quantum dot layer QDL1, a second quantum dot layer QDL2, a light transmission layer LTL, a bank layer BNK, and a second insulation layer IL2. A first quantum dot layer QDL1, a second quantum dot layer QDL2, and a light transmission layer LTL are illustrated, but multiple first quantum dot layers QDL1, multiple second quantum dot layers QDL2, and multiple light transmission layers LTL may be provided.

The first color filter CF1, the second color filter CF2, and the third color filter CF3 may be disposed under the second substrate SUB2. In a plan view, the first color filter CF1 may overlap the first light emitting area PA1, the second color filter CF2 may overlap the second light emitting area PA2, and the third color filter CF3 may overlap the third light emitting area PA3. The first color filter CF1 may include a red color filter. The second color filter CF2 may include a green color filter. The third color filter CF3 may include a blue color filter.

The black matrix BM may be disposed under the second substrate SUB2. In a plan view, the black matrix BM may overlap the non-display part NPA. The black matrix BM may be disposed between the first, second, and third color filters CF1, CF2 and CF3.

The low refraction layer LRL may be disposed under the second substrate SUB2 so as to cover or overlap the first, second, and third color filters CF1, CF2, and CF3, and the black matrix BM. The low refraction layer LRL may have a smaller refractive index than those of the first quantum dot layer QDL1, the second quantum dot layer QDL2, and the light transmission layer LTL. The low refraction layer LRL may include an organic layer, and scattering particles disposed in the organic layer and for scattering light. The first insulation layer IL1 may be disposed under the low refraction layer LRL. The first insulation layer IL1 may be an inorganic layer.

The bank layer BNK may be disposed under the first insulation layer ILL In a plan view, the bank layer BNK may overlap the non-display part NPA. In the back layer BNK, opening parts QOP may be defined and overlap the first, second, and third light emitting areas PA1, PA2, and PA3. The bank layer BNK may have black color.

The first and second quantum dot layers QDL1 and QDL2, and the light transmission layer LTL may be respectively disposed under the first, second, and third light emitting areas PA1, PA2, and PA3. The first and second quantum dot layers QDL1 and QDL2, and the light transmission layer LTL may be disposed on the display element layer DP-OLED.

The first and second quantum dot layers QDL1 and QDL2, and the light transmission layer LTL may be respectively disposed in the opening parts QOP. Accordingly, in a plan view, the first and second quantum dot layers QDL1 and QDL2, and the light transmission layer LTL may overlap the first, second, and third light emitting areas PA1, PA2, and PA3, respectively. The first quantum dot layer QDL1 may overlap the first light emitting area PA1, the second quantum dot layer QDL2 may overlap the second light emitting area PA2, and the light transmission layer LTL may overlap the third light emitting area PA3.

The second insulation layer IL2 may be disposed under the bank layer BNK, the first and second quantum dot layers QDL1 and QDL2, and the light transmission layer LTL. The second insulation layer IL2 may be an inorganic layer.

The first light L1 generated in the first, second, and third light emitting areas PA1, PA2, and PA3 may be provided to the first and second quantum dot layers QDL1 and QDL2, and the light transmission layer LTL. The first light L1 generated in the first light emitting area PA1 may be provided to the first quantum dot layer QDL1. The first light L1 generated in the second light emitting area PA2 may be provided to the second quantum dot layer QDL2. The first light L1 generated in the third light emitting area PA3 may be provided to the light transmission layer LTL.

The first quantum dot layer QDL1 may convert the first light L1 into second light L2. The second quantum dot layer QDL2 may convert the first light L1 into third light L3. For example, the second light L2 may be red light, and the third light L3 may be green light. The first quantum dot layer QDL1 may include first quantum dots (not shown), and the second quantum dot layer QDL2 may include second quantum dots (not shown). The light transmission layer LTL may include light scattering particles (not shown).

The first quantum dots may convert the first light L1 having a blue wavelength into the second light L2 having a red wavelength. The second quantum dots may convert the first light L1 having a blue wavelength into the third light L3 having a green wavelength. The first and second quantum dots may scatter the second and third light L2 and L3.

The light transmission light LTL may transmit the first light L1 without performing a light conversion operation. The first light L1 may be scattered by the light scattering particles in the light transmission layer LTL to be emitted.

The first quantum dot layer QDL1 may emit the second light L2, and the second quantum dot layer QDL2 may emit the third light L3, and the light transmission layer LTL may emit the first light L1. Accordingly, a predetermined image may be displayed by means of the second light L2, the third light L3, and the first light L1, which respectively display red, green, and blue colors.

The first, second, and third lights L1, L2, and L3 emitted from the light conversion layer LCL may be transmitted through the low refraction layer LRL, the first, second, and third color filters CF1, CF2, and CF3, and the second substrate SUB2 to be provided to the user. The first, second, and third lights L1, L2, and L3 may be refracted in the low refraction layer LRL, and then more scattered by the scattering particles disposed in the low refraction layer LRL to be emitted.

A portion of the first light L1 may not be converted by the first quantum dots but may be transmitted through the first quantum dots to be provided to the first color filter CF1. In other words, there may be first light L1 which does not contact the first quantum dots and is not converted into the second light L2. The first color filter CF1 may block any of other color lights. The first light L1, which has not been converted in the first quantum dot layer QDL1, may be blocked by the first color filter CF1, which has a red color filter, and may not be emitted to the upper part.

A portion of the first light L1 may not be converted by the second quantum dots but may be transmitted through the second quantum dots to be provided to the second color filter CF2. In other words, there may be first light L1 which does not contact the second quantum dots and is not converted into the third light L3. The second color filter CF2 may block any of other color lights. The first light L1, which has not been converted in the second quantum dot layer QDL2, may be blocked by the second color filter CF2 that has a green color filter, and may not be emitted to the upper part.

External light may be provided towards the display panel DP above the display device DD. The external light may be white light. The white light may include red light, green light, and blue light. In case that the first, second, and third color filters CF1, CF2, and CF3 are not used, the external light may be reflected by metal layers (e.g., wirings) inside the display panel DP, and then provided to an external user without being changed. In this case, as light reflected by a mirror, the external light may be viewed by the user.

The first, second, and third color filters CF1, CF2 and CF3 may prevent the external light from being reflected. For example, the first, second, and third color filters CF1, CF2 and CF3 may respectively transmit the external light of red, green, and blue colors.

In an embodiment, the green light and blue light of the external light provided to the first color filter CF1 may be blocked by the first color filter CF1 including the red color filter. Accordingly, the external light provided to the first color filter CF1 may be filtered by the first color filter CF1 to be the same red light as the light emitted from the first quantum dot layer QDL1.

The red light and blue light of the external light provided to the second color filter CF2 may be blocked by the second color filter CF2 including the green color filter. Accordingly, the external light provided to the second color filter CF2 may be filtered by the second color filter CF2 to be the same green light as the light emitted from the second quantum dot layer QDL2.

The red light and green light of the external light provided to the third color filter CF3 may be blocked by the third color filter CF3 including the blue color filter. Accordingly, the external light provided to the third color filter CF3 may be filtered by the third color filter CF3 to be the same blue light as the light emitted from the light transmission layer LTL. Accordingly, the external light may be blocked by the first, second, and third color filters CF1, CF2 and CF3, and reflection of the external light may be reduced.

The black matrix BM may block light unnecessary in the non-light emitting area NPA. For example, the black matrix BM may prevent the first light L1, the second light L2, and the third light L3 from being mixed in the non-light emitting area NPA. The bank layer BNK may have black color and may have the same light block function as the black matrix BM.

First opening parts OP1 may be defined in the first substrate SUB1. The first opening parts OP1 may respectively overlap the light emitting areas PA1, PA2 and PA3. However, the embodiments are not limited thereto. The first opening parts OP1 may partially overlap or may not overlap the light emitting areas PA1, PA2 and PA3, respectively. The first opening parts OP1 may be arrayed in an equal interval but are not limited thereto. The first opening parts OP1 may be arrayed in an irregular interval.

The heat dissipation layer RHL may include first heat dissipation layers RHL1, a second heat dissipation layer RHL2, and an insulation layer INS. The insulation layer INS may be disposed under the first substrate SUB1. The insulation layer INS may include an organic layer. The insulation layer INS may have a smaller thickness than the first substrate SUB1. The thickness of the insulation layer INS and the thickness of the first substrate SUB1 may be defined as the thicknesses measured in the third direction DR3.

Second opening parts OP2, which overlap the first opening parts OP1, may be defined in the insulation layer INS. Accordingly, the second opening parts OP2 may respectively overlap the first, second, and third light emitting areas PA1, PA2 and PA3.

The first heat dissipation layers RHL1 may be disposed in the first opening parts OP1. Accordingly, in a plan view, the first heat dissipation layers RHL1 may respectively overlap the light emitting areas PA1, PA2 and PA3.

The second heat dissipation layer RHL2 may be disposed under the insulation layer INS and the first heat dissipation layers RHL1. The second heat dissipation layer RHL2 may be disposed below the first substrate SUB1 so as to cover or overlap the insulation layer INS. The second heat dissipation layer RHL2 may be disposed in the second opening parts OP2 to contact the first heat dissipation layers RHL1 in the second opening parts OP2.

The second heat dissipation layer RHL2 may be successively disposed along the bottom surfaces of the first heat dissipation layers RHL1, the inner side surface IS of the insulation layer INS in which the second opening parts OP2 are defined, and the bottom surface LS of the insulation layer INS. However, the embodiments are not limited thereto, and if the second heat dissipation layer RHL2 contacts the first heat dissipation layers RHL1 in the second opening parts OP2, multiple second heat dissipation layers RHL2 may be provided and separated on the bottom surface LS of the insulation layer INS.

The thickness of each of the first heat dissipation layer RHL1 may be greater than that of the second heat dissipation layer RHL2. The thickness of each of the first heat dissipation layers RHL1 may be defined with a numerical value measured in the third direction DR3. The third direction DR3 may be defined as a direction vertical to the top surface of the first substrate SUB1.

The thickness of the second heat dissipation layer RHL2 may be defined as the thickness measured in a direction vertical to a contact surface that the second heat dissipation layer RHL2 contacts. For example, the thickness of the second heat dissipation layer RHL2 may be defined as the thickness measured in a direction vertical to each of the bottom surfaces of the first heat dissipation layers RHL1, the inner side surface IS of the insulation layer INS, and the bottom surface LS of the insulation layer INS.

The second heat dissipation layer RHL2, which has a smaller thickness, may be disposed to have a step structure (or height difference) by being disposed to contact the bottom surfaces of the first heat dissipation layers RHL1, the inner side surface IS of the insulation layer INS, and the bottom surface LS of the insulation layer INS. For example, the second heat dissipation layer RHL2 may be disposed to have the step from the bottom surfaces of the first heat dissipation layers RHL1 to the bottom surface LS of the insulation layer INS. The second heat dissipation layer RHL2 is formed not to have a flat shape, but to have the step, and thus the surface area of the second heat dissipation layer RHL2 may increase.

Each of the first heat dissipation layers RHL1 and the second heat dissipation layer RHL2 may include a metal material. For example, the first heat dissipation layers RHL1 and the second heat dissipation layer RHL2 may include silver (Ag) or copper (Cu) which has a high thermal conductivity.

In case that the pixels PX disposed in the pixel layer PXL are driven, heat HT may be generated in the display panel DP. The heat HT may be primarily delivered to the first heat dissipation layers RHL1. The heat HT may be secondarily delivered to the second heat dissipation layer RHL2 through the first heat dissipation layers RHL1.

A heat dissipation material such as a metal may dissipate heat more effectively, as the surface area is wider. As described above, since the second heat dissipation layer RHL2 formed to have a step without having a flat shape increases in surface area, the heat HT may be dissipated to the outside more effectively by the second heat dissipation layer RHL2. Since the heat HT generated in the display panel DP is more efficiently dissipated to the outside, the lifetime and light emission efficiency of the pixels PX may be enhanced.

Figure 6:
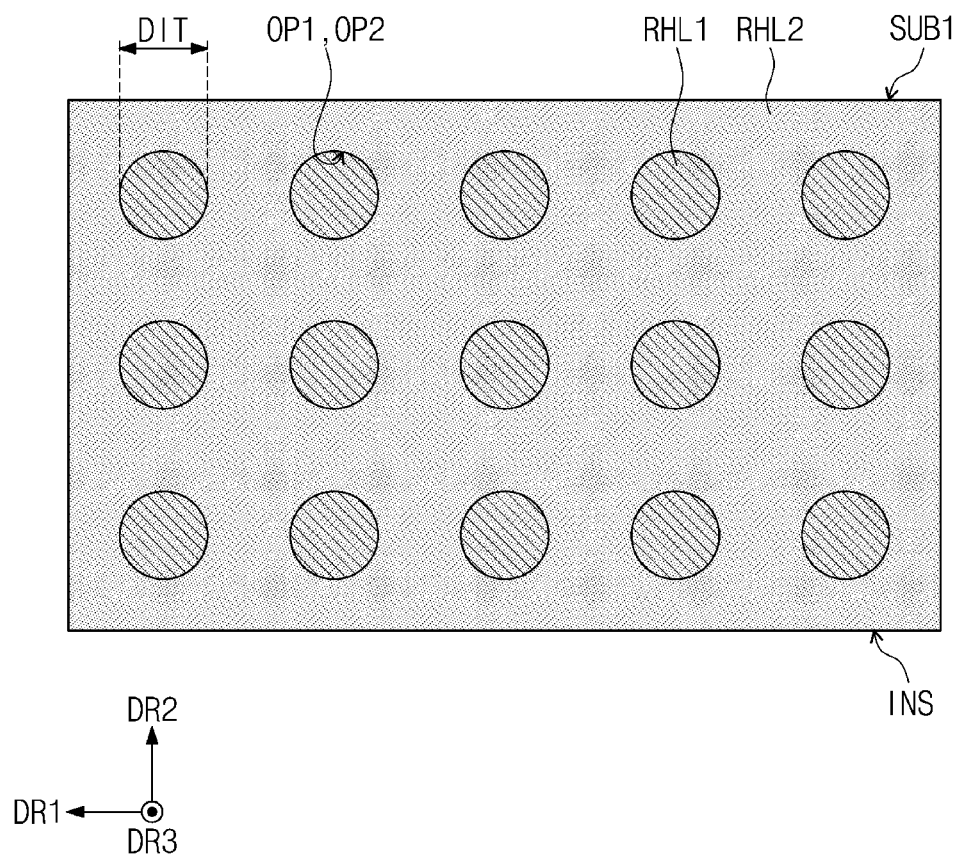
FIG. 6 is a schematic plan view illustrating a planar arrangement of first heat dissipation layers illustrated in FIG. 5.
Figure 7:
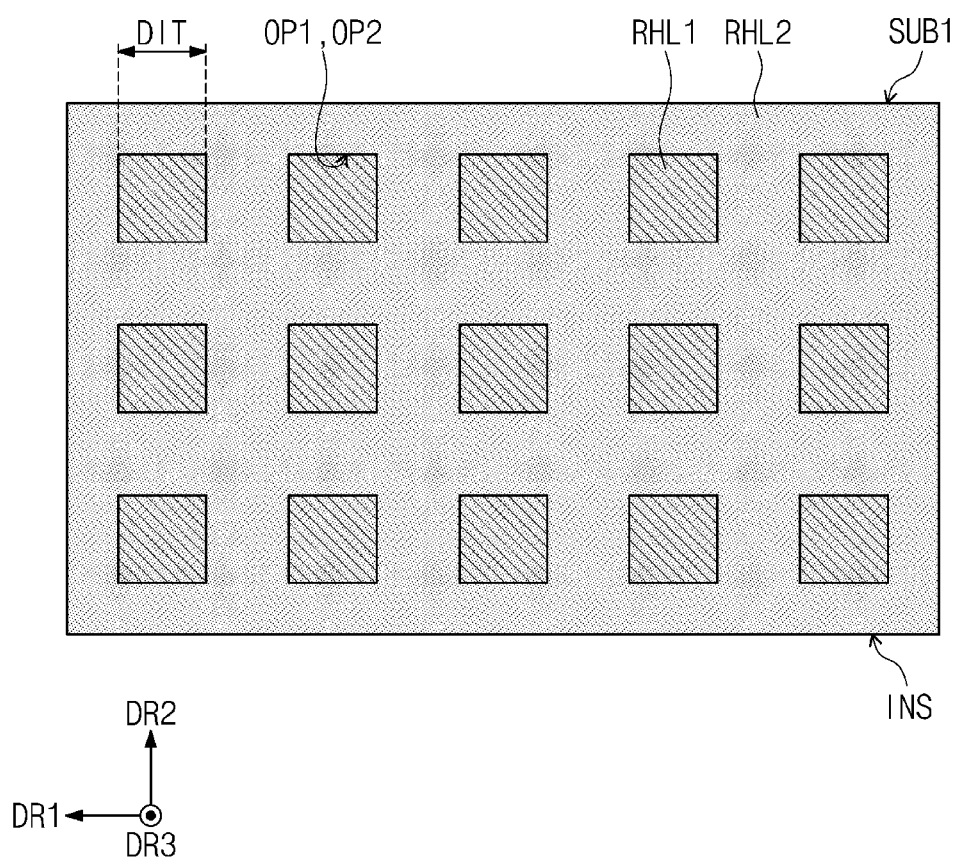
FIGS. 7 and 8 are schematic plan views illustrating various shapes of the first heat dissipation layers.
Figure 8:
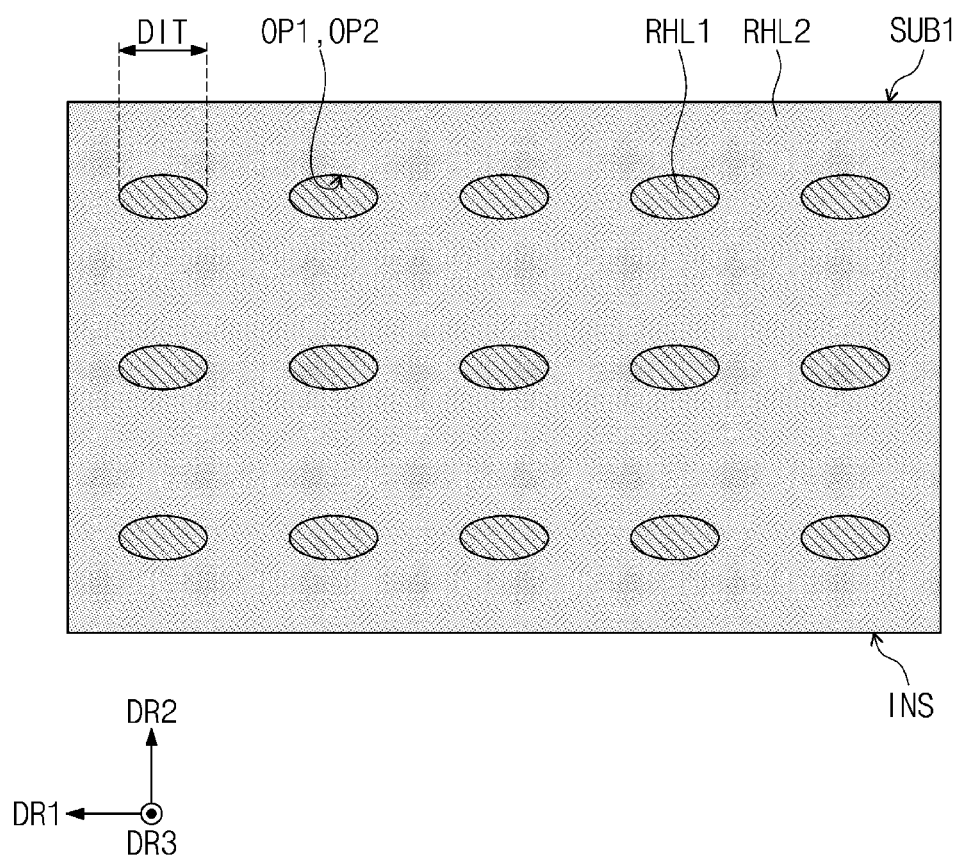

FIG. 6 is a schematic plan view illustrating a planar arrangement of the first heat dissipation layers illustrated in FIG. 5. FIGS. 7 and 8 are schematic plan views illustrating various shapes of the first heat dissipation layers.

The first heat dissipation layers RHL1 having three rows and five columns are illustrated, but the number of the first heat dissipation layers RHL1 is not limited thereto.

Referring to FIG. 6, in a plan view, the first and second opening parts OP1 and OP2 may have a circular shape. The first and second opening parts OP1 and OP2 may be disposed in the first direction DR1 and the second direction DR2 with an equivalent interval in a matrix type. However, the embodiments are not limited thereto. In an embodiment, the first and second opening parts OP1 and OP2 may be randomly disposed in different intervals.

According to the arrangement of the first opening parts OP1, in a plan view, the first heat dissipation layers RHL1 may have a circular shape. The first heat dissipation layers RHL1 are disposed in the first direction DR1 and the second direction DR2 with an equivalent interval in a matrix type, but the embodiments are not limited thereto. The first heat dissipation layers RHL1 may be randomly disposed in different intervals. Each of the first heat dissipation layers RHL1 may have the diameter DIT of about 100 μm to about 150 μm.

In an embodiment, the first opening parts OP1 and the second opening parts OP2 may have the same circular shape, but are not limited thereto. As long as the first opening parts OP1 and the second opening parts OP2 overlap each other, they may have different shapes. For example, in a plan view, the first opening parts OP1 may have a circular shape, and the second opening parts OP2 may have a polygonal or elliptical shape.

Referring to FIGS. 7 and 8, in a plan view, the first and second opening parts OP1 and OP2 may have various shapes other than the circular shape. In a plan view, the first and second opening parts OP1 and OP2 may have a polygonal or elliptical shape. For example, in a plan view, the first and second opening parts OP1 and OP2 may have a rectangular shape as shown in FIG. 7. In a plan view, the first and second opening parts OP1 and OP2 may an elliptical shape as shown in FIG. 8.

FIGS. 9 to 17 schematically illustrates a method for manufacturing a display device according to an embodiment.

Figure 9:
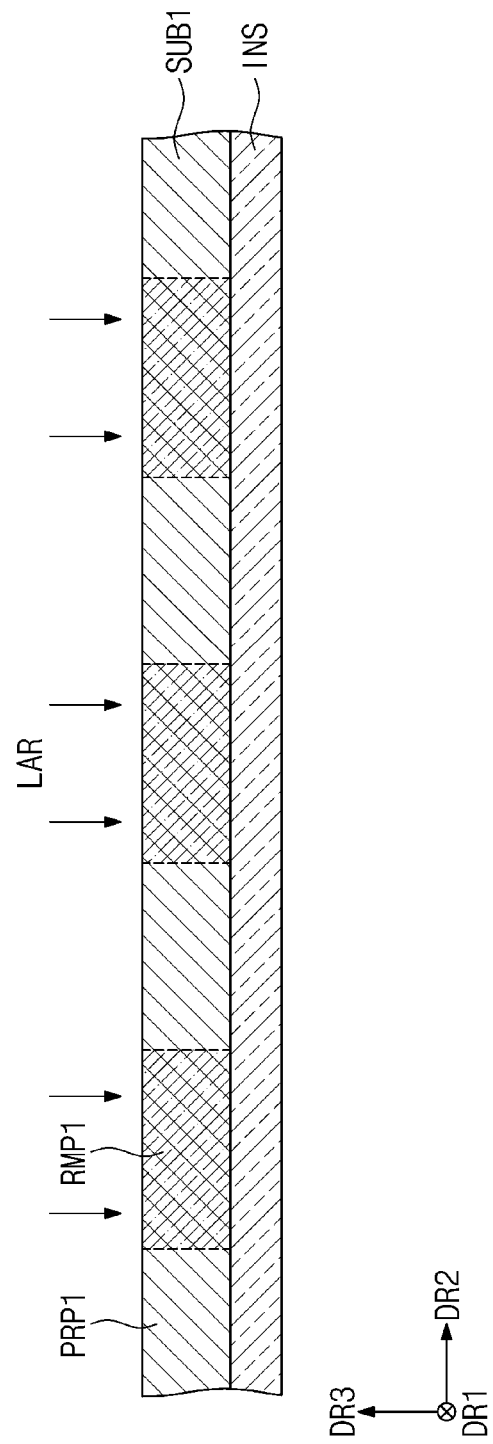
FIGS. 9 to 17 schematically illustrates a method for manufacturing a display device according to an embodiment.

Referring to FIG. 9, the first substrate SUB1 may include first removal parts RMP1 and first peripheral parts PRP1 around the respective first removal parts RMP1. The insulation layer INS may be provided (or formed) under the first substrate unit SUB1.

The first removal parts RMP1 may be irradiated with a laser beam LAR on the first substrate SUB1. The laser beam LAR may be a femtosecond laser beam. The first removal parts RMP1 irradiated with the laser beam LAR may be more easily etched with an etching liquid (e.g., hydrogen fluoride (HF) or Potassium hydroxide (KOH)). Such a process may be defined as a Laser Induced Deep Etching (LIDE) process.

Figure 10:
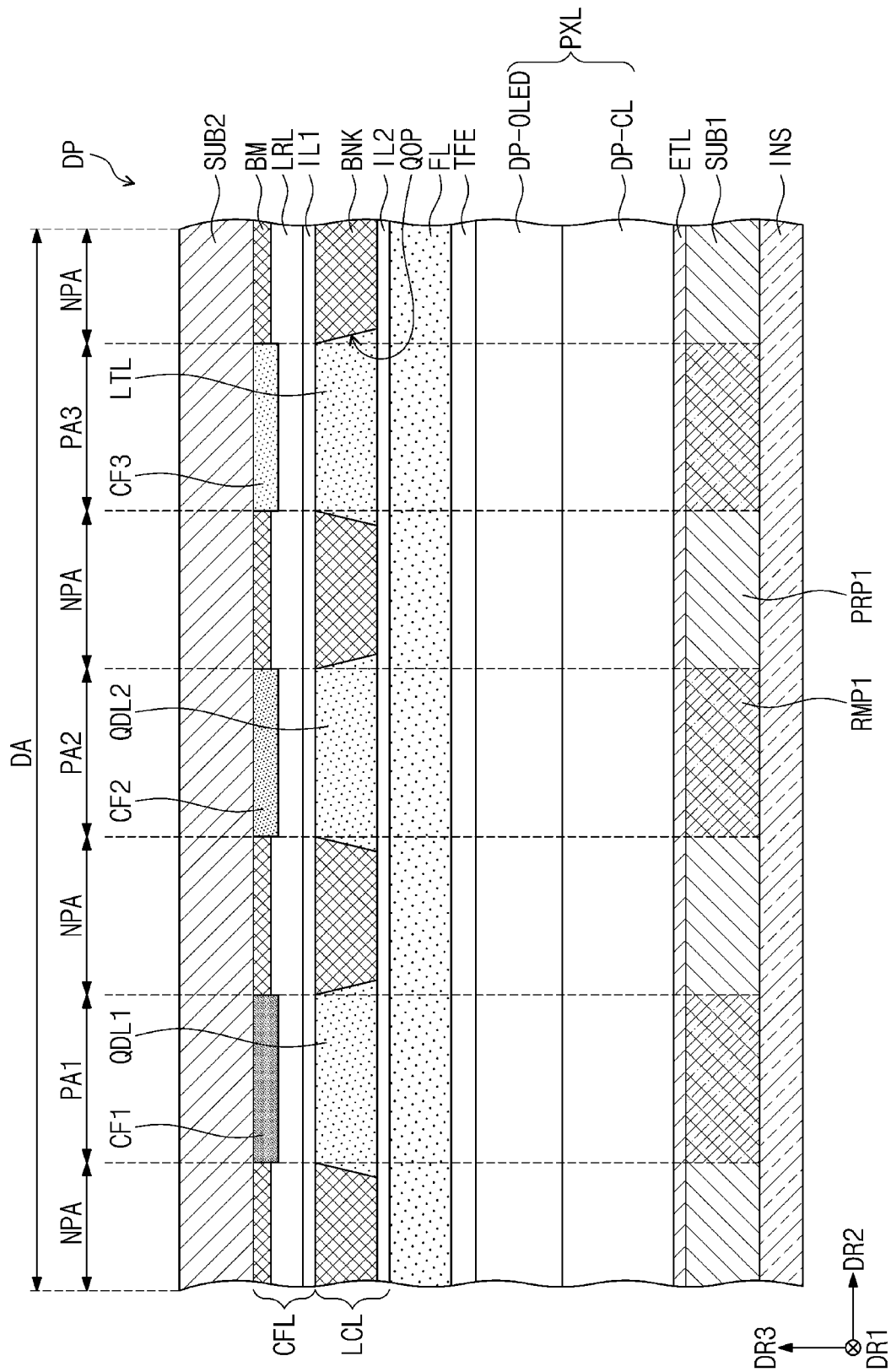

Referring to FIG. 10, the etching stop layer ETL may be provided on the first substrate SUB1. The pixel layer PXL may be provided on the etching stop layer ETL, and the thin film encapsulation layer TFE may be provided on the pixel layer PXL. The color filter layer CFL and the light conversion layer LCL may be provided under the second substrate SUB2, and the filling material FL may be provided between the light conversion layer LCL and the thin film encapsulation layer TFE.

In a plan view, the first removal parts RMP1 may overlap the light emitting areas PA1, PA2 and PA3. In a plan view, the first peripheral part PRP1 may overlap the foregoing non-display area NPA.

Figure 11:
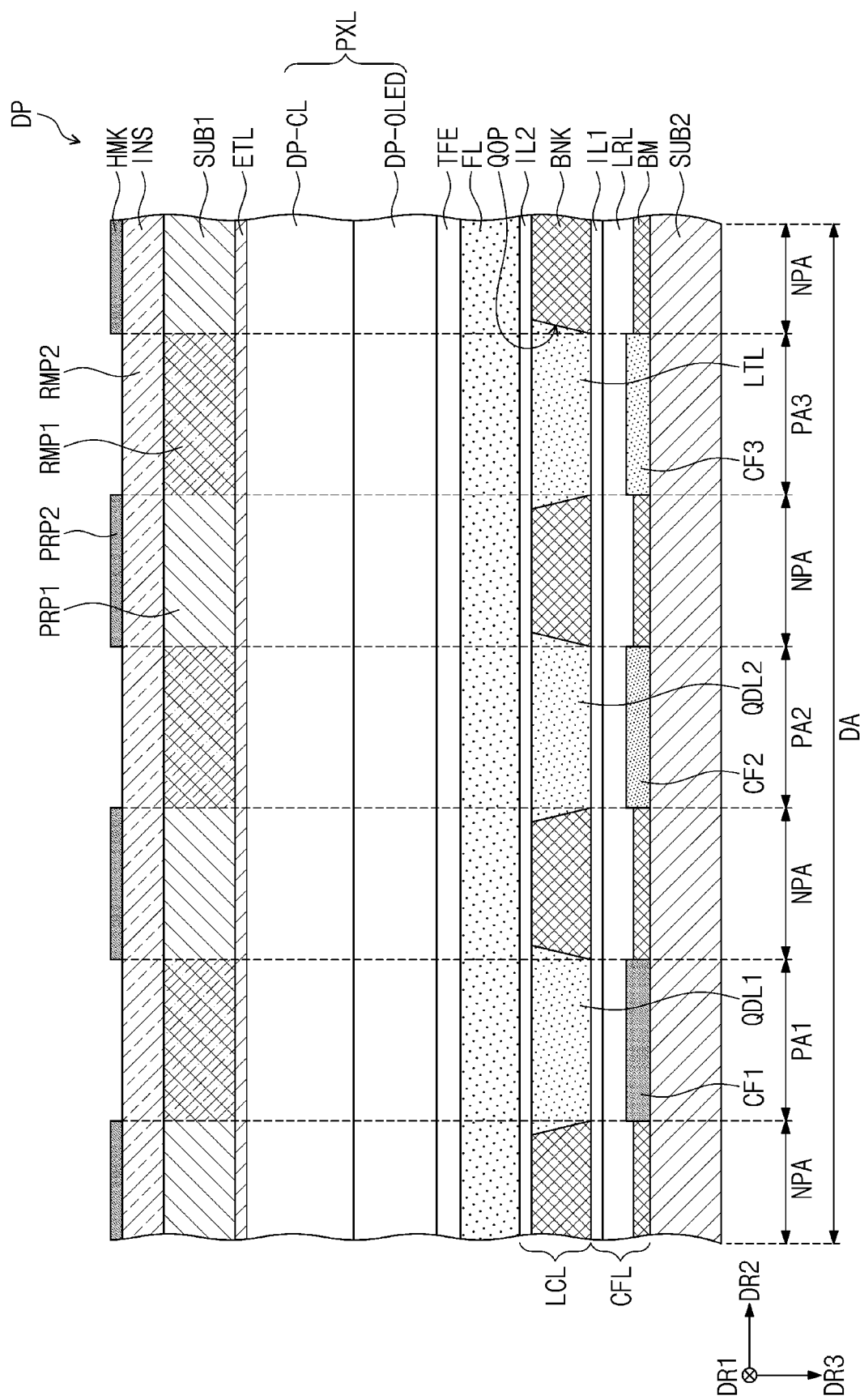

Referring to FIG. 11, the display panel DP shown in FIG. 10 is turned upside down, and the first substrate SUB1 is disposed on the second substrate SUB2. The insulation layer INS may include second removal parts RMP2 and second peripheral parts PRP2 around the respective second removal parts RMP2. The second removal parts RMP2 may be disposed on the first removal parts RMP1 to overlap the first removal parts RMP1. The second peripheral parts PRP2 may be disposed on the first peripheral parts PRP1 to overlap the first peripheral parts PRP1.

A hard mask layer HMK may be disposed on the insulation layer INS. The hard mask layer HMK may be disposed on the second peripheral parts PRP2 and may not be disposed on the second removal parts RMP2. As the hard mask layer HML, a transparent electrode such as indium zinc oxide (IZO) may be used.

The hard mask layer HMK may be formed through the typical photolithography process. For example, a mask forming layer including indium zinc oxide (IZO) may be formed on the entire top surface of the insulation layer INS, and a photoresist may be provided on the mask forming layer. Parts of the photoresist, which overlap the second removal parts RMP2, may be removed through exposure and develop processes. Thereafter, the parts of the mask forming layer, which overlap the second removal parts RMP2, are removed by a wet etching method with the photoresist taken as a mask to form the hard mask layer HML illustrated in FIG. 11.

Figure 12:
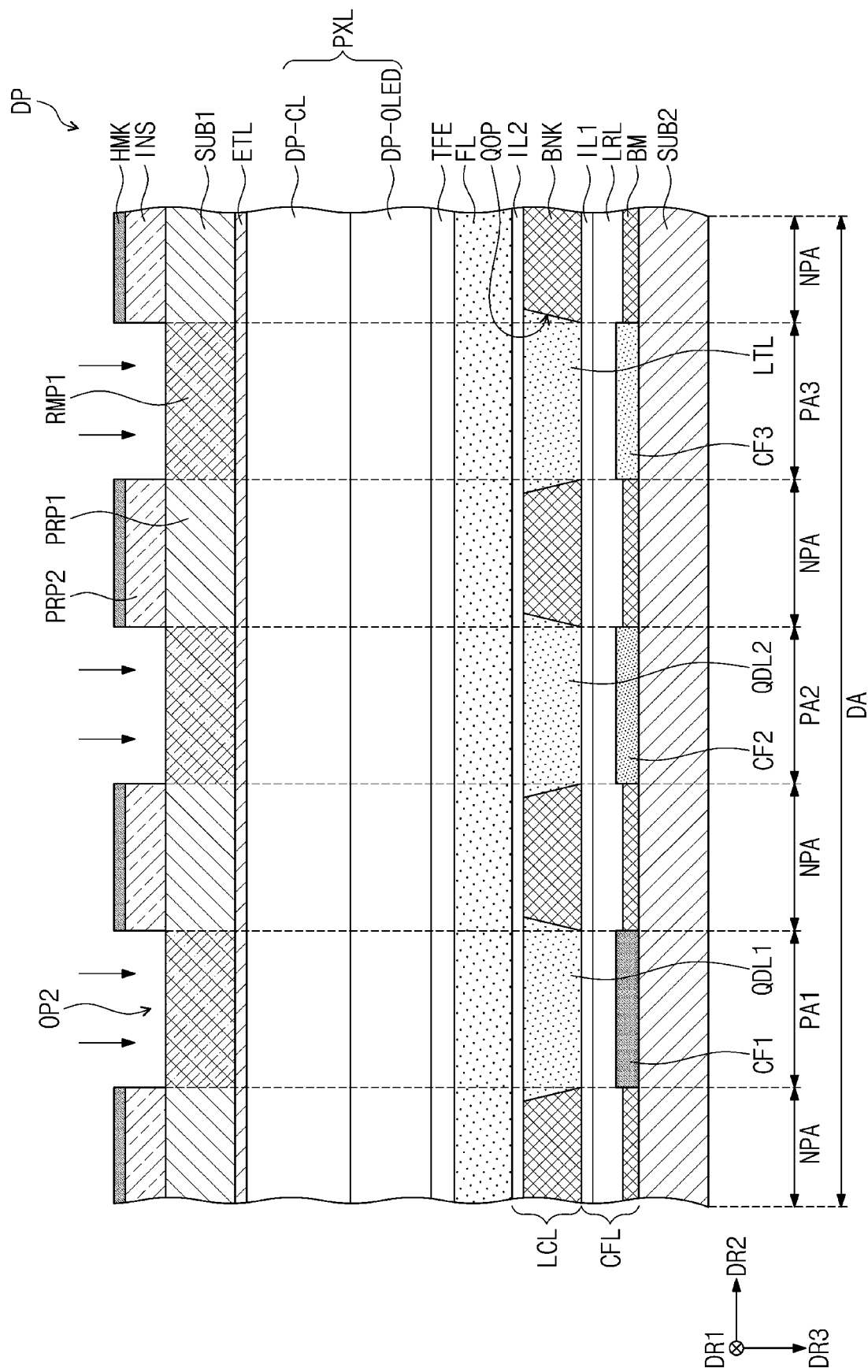

Referring to FIG. 12, the second removal parts RMP2 of the insulation layer INS may be removed with the hard mask layer taken as a mask. The second removal parts RMP2 may be removed in a dry etching manner With the removal of the second removal parts RMP2, the second opening parts OP2 may be defined in the insulation layer INS. In a plan view, the second removal parts OP2 may respectively overlap the light emitting areas PA1, PA2, and PA3.

The second peripheral parts PRP2 of the insulation layer INS may remain to be disposed on the first peripheral parts PRP1. In other words, the insulation layer INS may be disposed only on the first peripheral parts PRP1 of the first substrate SUB1.

Figure 13:
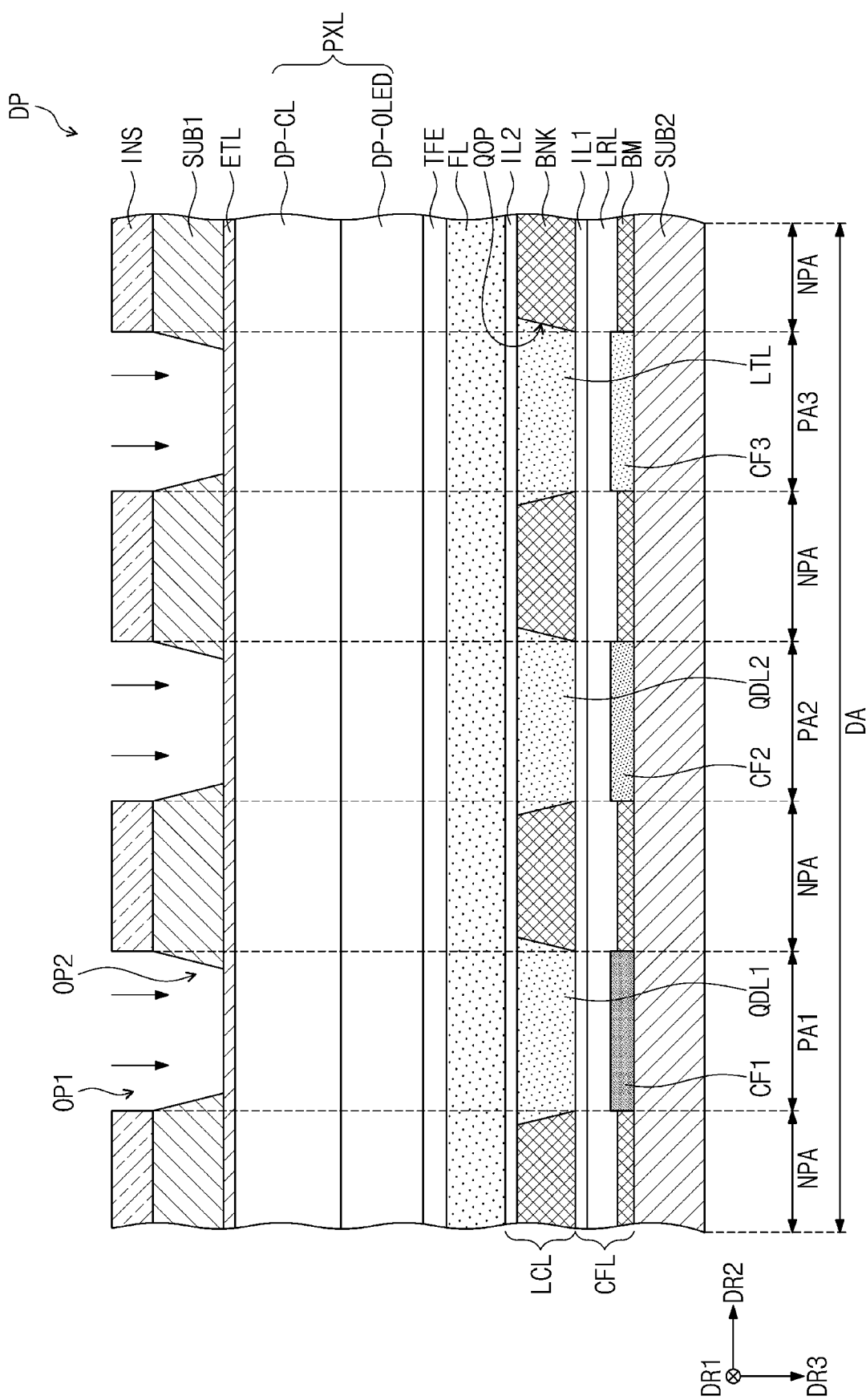
Figure 14:
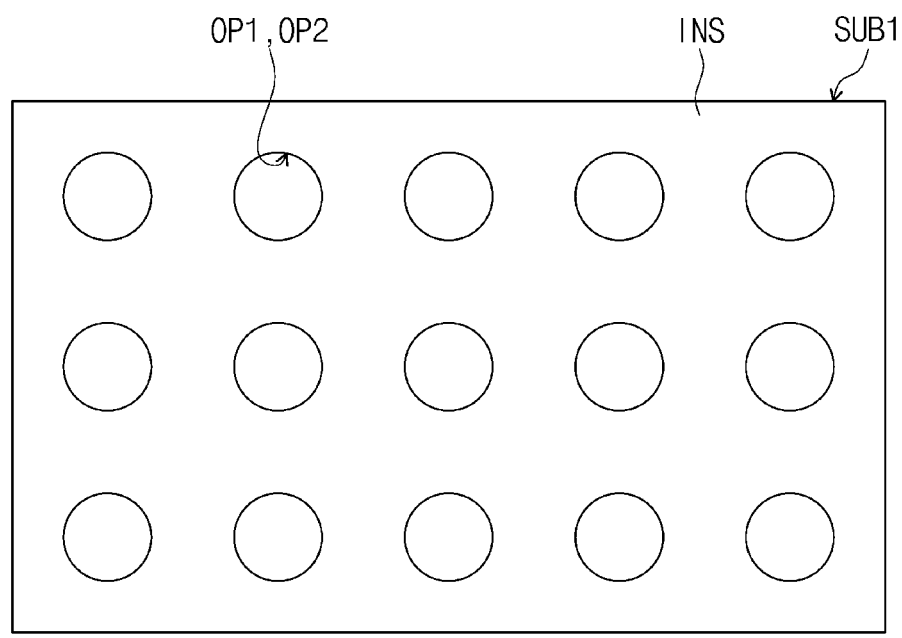
Figure 14:
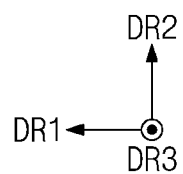

Referring to FIGS. 13 and 14, the first removal parts RMP1 are removed to define the first opening parts OP1 in the first substrate SUB1. In a plan view, the first opening parts OP1 may respectively overlap the light emitting areas PA1, PA2, and PA3. The first and second opening parts OP1 and OP2 may have a circular shape and may be defined in the first substrate SUB1 and the insulation layer INS in a matrix type.

The first removal parts RMP2 may be removed by a wet etching method. For example, the first removal parts RMP2 may be removed with an etching liquid such as HF or KOH. Since the first removal parts RMP1 have been irradiated with the laser beam LAR, the first removal parts RMP1 may be more easily etched.

Even in case that the first peripheral parts RPR1 have not been irradiated with the laser beam LAR, the first peripheral parts RPR1 may be etched with the etching liquid. However, the etching speed may be slower than that of the first removal parts RMP1. In case that the insulation layer INS is not disposed on the first peripheral parts PRP1, not only the first removal parts RMP1 but also the first peripheral parts PRP1 adjacent to the first removal parts RMP1 may be etched with the etching liquid. Accordingly, the size of the first opening parts OP1 may extend. The greater the size of the first opening parts OP1 are, the weaker the strength of the first substrate SUB may become.

However, in an embodiment, since the insulation layer INS is disposed on the first peripheral parts PRP1, the etching liquid may not be provided due to the insulation layer INS. In other words, the second peripheral parts PRP2 of the insulation layer INS may block the etching liquid from being provided to the first peripheral parts PRP1. Accordingly, the size of the first opening parts OP1 may be easily controlled by the second peripheral parts PRP2.

The etching stop layer ETL may prevent the etching liquid from being permeated to the pixel layer PXL through the first opening parts OP1, in case that the first opening parts OP1 are formed by the etching liquid.

Figure 15:
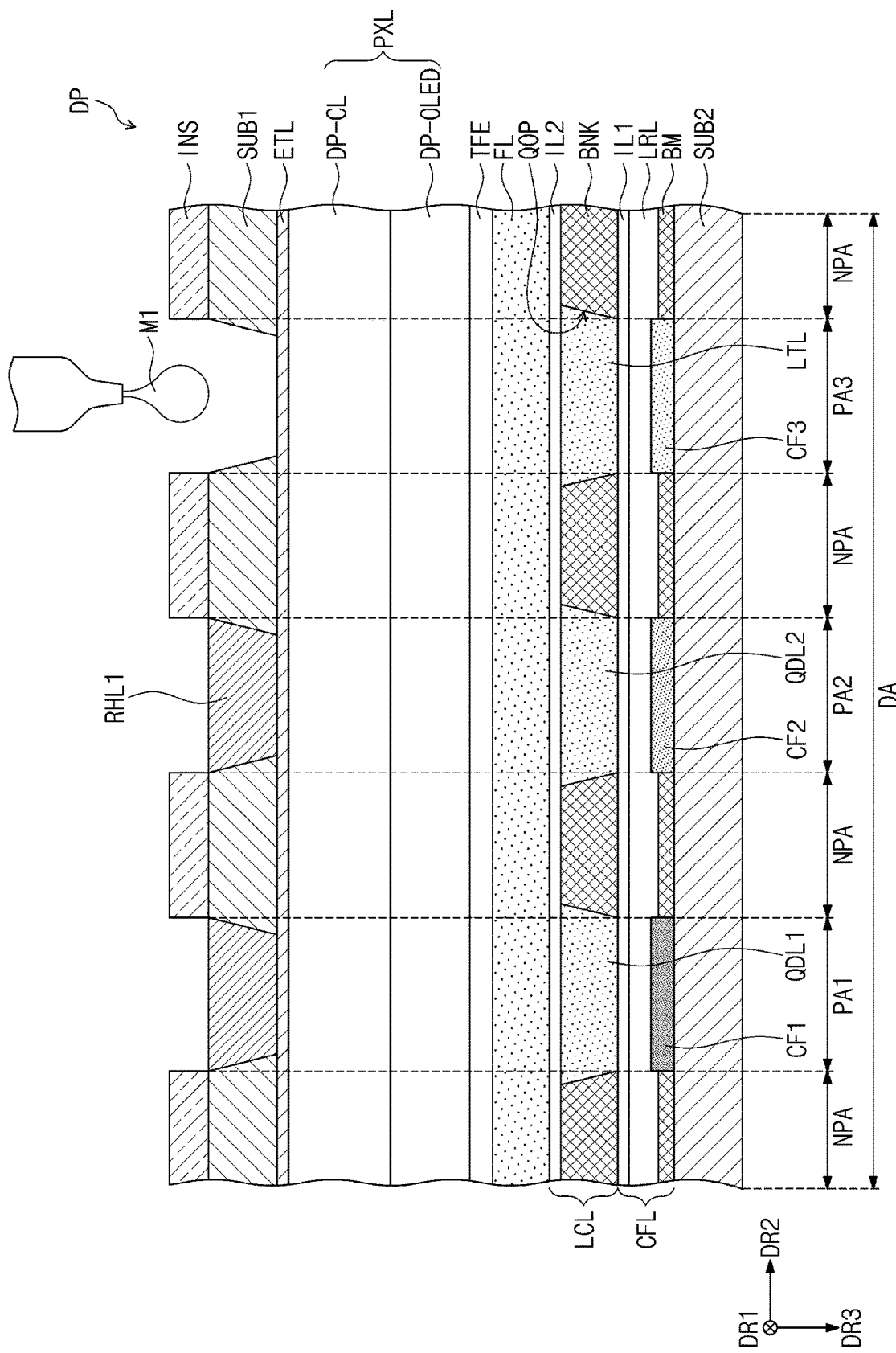

Referring to FIG. 15, a first material M1 including a metal may be provided to the first opening parts OP1. The first material M1 may be provided to the first opening parts OP1 by an inkjet printing or dispensing method. The first material M1 may include a metal ink such as silver or copper. The first material M1 may be cured to form the first heat dissipation layers RHL1 in the first opening parts OP1.

Figure 16:
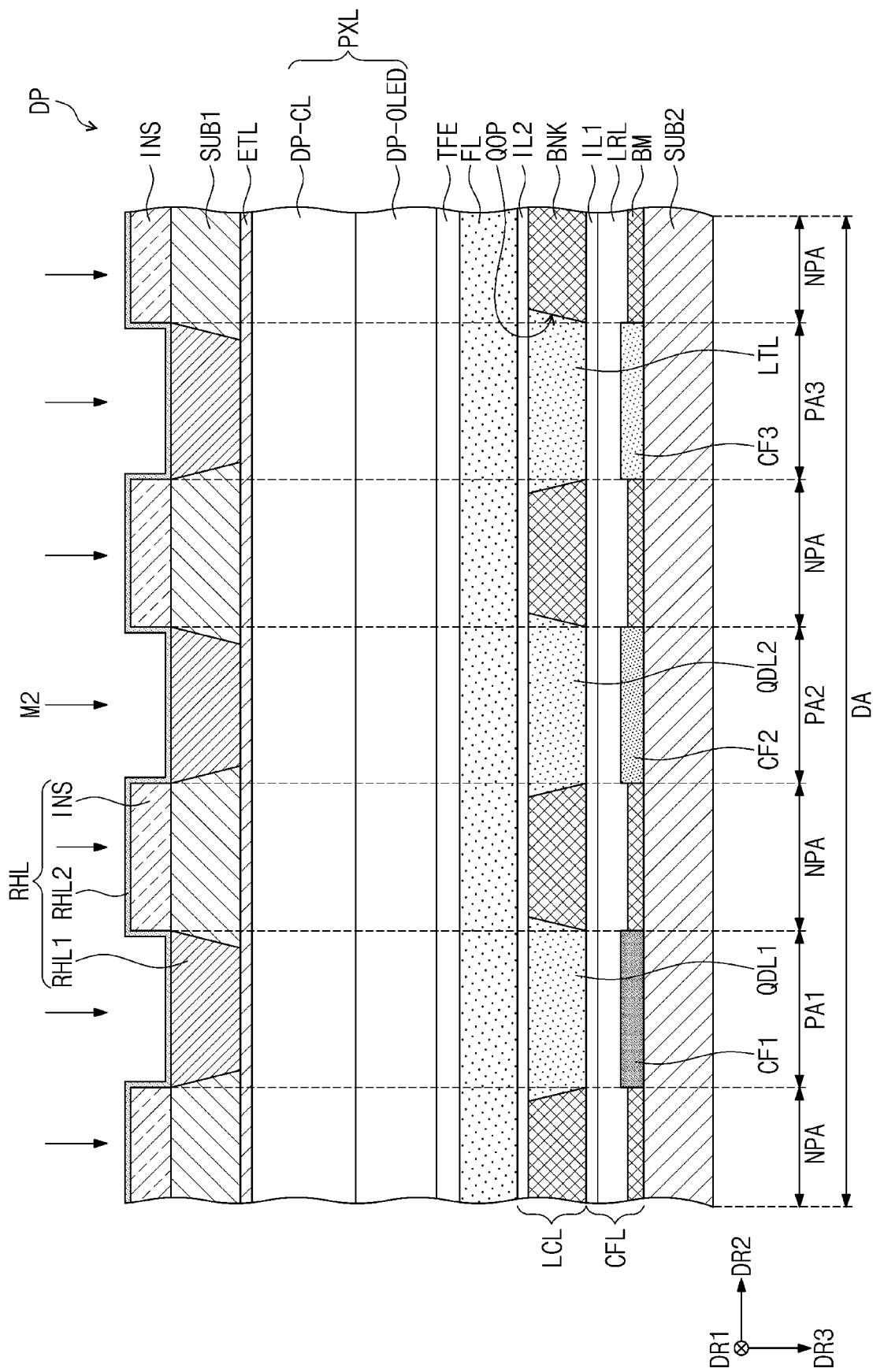

Referring to FIG. 16, a second material M2 including a metal may be provided to the second opening parts OP2 to be provided on the first heat dissipation layers RHL1. The second material M2 may be provided on the insulation layer INS. The second heat dissipation layer RHL2 may be formed by means of the second material M2. The second material M2 may be provided on the first heat dissipation layers RHL1 and the insulation layer ISL through a sputtering process.

Figure 17:
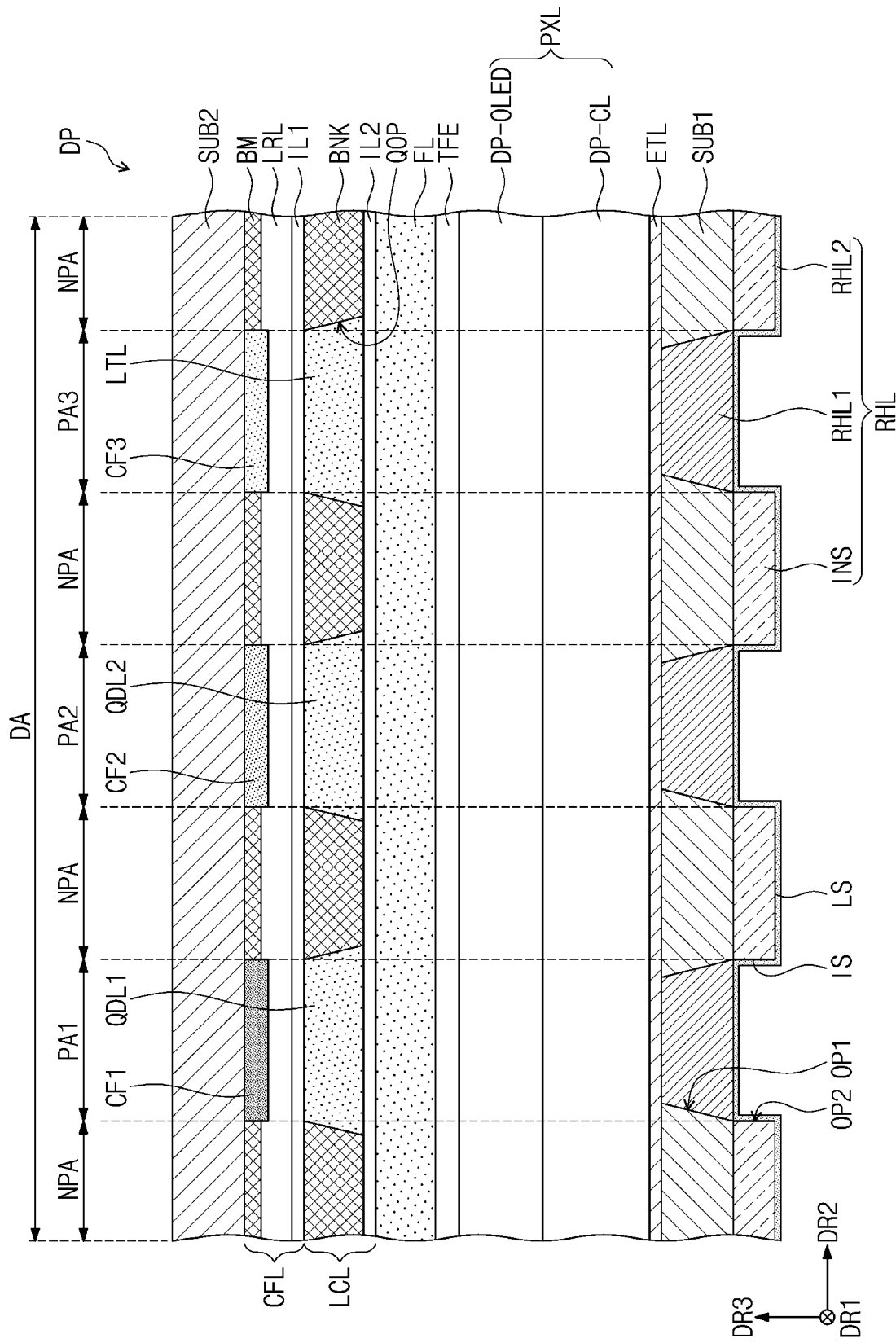

Referring to FIG. 17, after the heat dissipation layers RHL are formed on the display panel DP, the display panel DP may be turned upside down again so that the second substrate SUB2 is disposed on the first substrate SUB1. Accordingly, the display device DD in which the heat dissipation function is enhanced may be manufactured.

Figure 18:
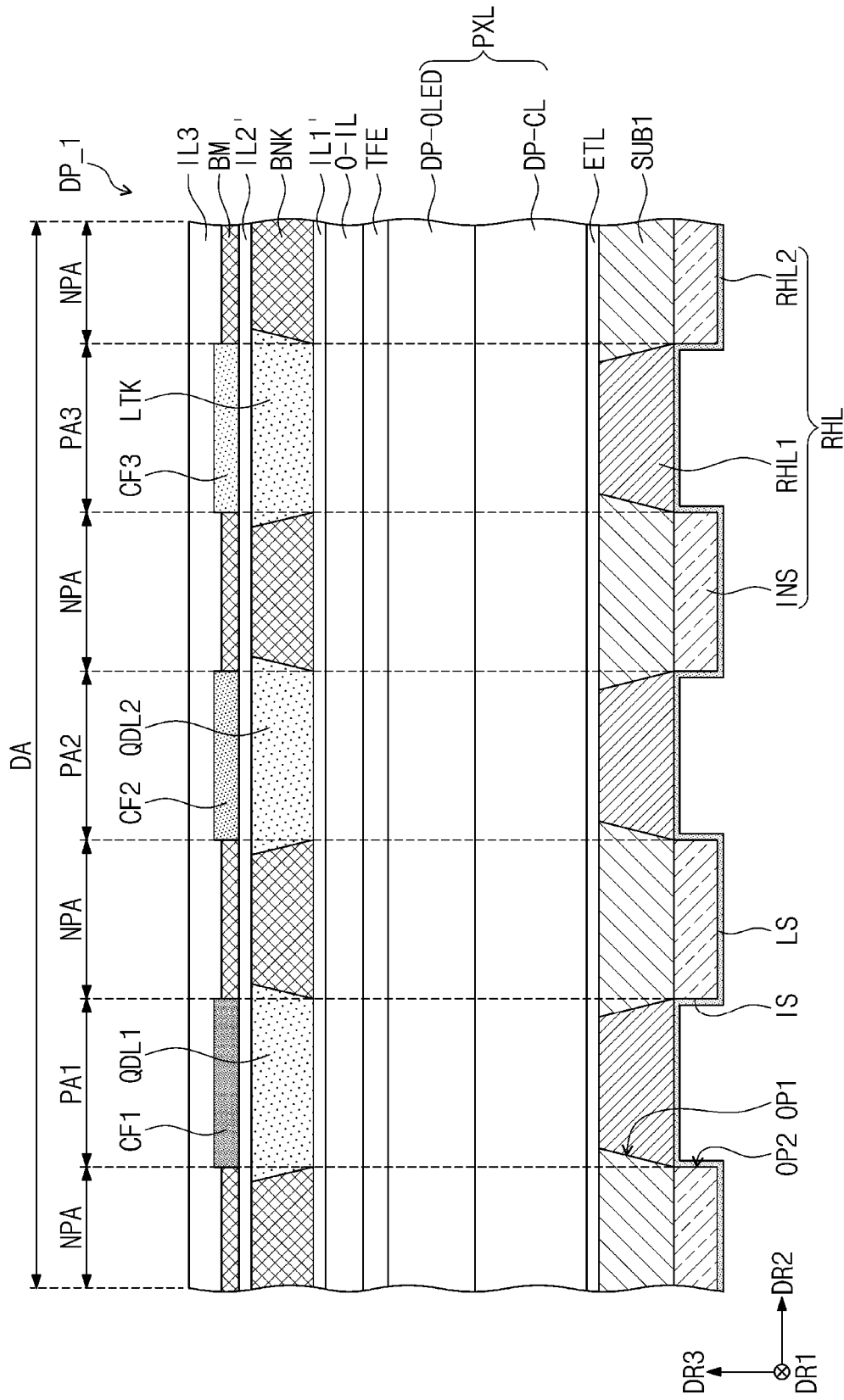
FIG. 18 schematically illustrates the configuration of a display panel according to another embodiment.

FIG. 18 illustrates the configuration of a display panel according to another embodiment.

For example, FIG. 18 is a schematic cross-sectional view illustrating a cross-section in comparison to FIG. 5, and hereinafter, the configuration of the display panel DP_1 illustrated in FIG. 18 will be described on the basis of different components from those of the display panel DP illustrated in FIG. 5.

Referring to FIG. 18, descriptions from the heat dissipation layer RHL to the thin film encapsulation layer TFE are identical or similar to corresponding ones of the display panel DP illustrated in FIG. 5, and thus descriptions of them will be omitted. An insulation layer O-IL may be disposed on the thin film encapsulation layer TFE. A first insulation layer IL1' may be disposed on the insulation layer O-IL.

The first and second quantum dot layers QDL1 and QDL2, the light transmission layer LTL, and the bank layer BNK may be disposed on the first insulation layer ILF. The opening parts QOP overlapping the first, second, and third light emitting areas PA1, PA2, and PA3 may be defined in the bank layer BNK, and the first and second quantum dot layers QDL1 and QDL2, and the light transmission layer LTL may be respectively disposed in the opening parts QOP.

A second insulation layer IL2' may be disposed on the first and second quantum dot layer QDL1 and QDL2, the light transmission layer LTL, and the bank layer BNK. The first, second, and third color filters CF1, CF2, and CF3, and the black matrix BM may be disposed on the second insulation layer IL2'.

In a plan view, the first, second, and third color filters CF1, CF2, and CF3 may be disposed so as to respectively overlap the first and second quantum dot layer QDL1 and QDL2, and the light transmission layer LTL. In a plan view, the black matrix BM may overlap the bank layer BNK.

A third insulation layer IL3 may be disposed on the first, second, and third color filters CF1, CF2, and CF3, and the black matrix BM. The insulation layer O-IL and the first, second, and third insulation layers IL1', IL2', and IL3' may include an organic layer or an inorganic layer.

Unlike the display panel DP illustrated in FIG. 5, the display panel DP_1 illustrated in FIG. 18 may not include the second substrate SUB2.

According to the embodiments, the first heat dissipation layers are disposed in the first opening parts defined in the first substrate, and the second heat dissipation layer is disposed under the insulation layer in which the second opening parts, which are disposed under the first substrate and overlap the first opening units, are defined. The second heat dissipation layer contacts the first heat dissipation layers in the first opening parts, and thus heat generated in the display panel may be more efficiently dissipated to the outside through the first heat dissipation layers and the second heat dissipation layer.

Although the embodiments of the disclosure have been described, it is understood that the disclosure should not be limited to these embodiments but various changes and modifications can be made by one ordinary skilled in the art within the spirit and scope of the disclosure as hereinafter claimed. In addition, the embodiments disclosed in the disclosure are not intended to limit the technical spirit of the disclosure, and the scope of the disclosure should be interpreted based on the following appended claims, and it should be appreciated that all technical aspects included within a range equivalent thereto are included in the scope of the disclosure.

What is claimed is:

1. A manufacturing method of a display device comprising:
    forming an insulation layer under a first substrate comprising a first removal part and a first peripheral part adjacent to the first removal part;
    forming a pixel on the first substrate;
    removing a second removal part of the insulation layer which overlaps the first removal part in a plan view;
    removing the first removal part;
    forming a first heat dissipation layer in the first opening part of the first substrate, the first opening part being formed by the removing of the first removal part; and
    forming a second heat dissipation layer in a second opening part of the insulation layer, the second opening part being formed by the removing of the second removal part.

2. The manufacturing method of claim 1, wherein the forming of the first heat dissipation layer in the first opening part includes an inkjet printing process or a dispensing process.

3. The manufacturing method of claim 1, wherein the forming of the second heat dissipation layer in the second opening part includes a sputtering process.

4. The manufacturing method of claim 1, wherein the forming of the second heat dissipation layer comprises forming the second heat dissipation layer under the first substrate to overlap the insulation layer.

5. The manufacturing method of claim 4, wherein the forming of the second heat dissipation layer comprises forming the second heat dissipation layer to contact the first heat dissipation layer in the second opening part and to have a step structure on a bottom surface of the insulation layer under the first heat dissipation layer.

6. The manufacturing method of claim 1, wherein the first heat dissipation layer has a greater thickness than a thickness of the second heat dissipation layer.

7. The manufacturing method of claim 1, further comprising:
    forming an etching stop layer on the first substrate, wherein the forming of the pixel comprises disposing the pixel on the etching stop layer on the first substrate.

8. The manufacturing method of claim 1, wherein the pixel comprises:

a light emitting area; and
a non-light emitting area adjacent to the light emitting area,
the first heat dissipation layer overlaps the light emitting area in the plan view.

9. The manufacturing method of claim 1, further comprising:
irradiating the first removal part with a laser beam.

* * * * *